(12) United States Patent
Zhou et al.

(10) Patent No.: US 9,646,999 B1
(45) Date of Patent: May 9, 2017

(54) THIN FILM TRANSISTOR, ARRAY SUBSTRATE AND METHOD OF FORMING THE SAME

(71) Applicant: Shenzhen China Star Optoelectronics Technology Co., Ltd., Shenzhen, Guangdong (CN)

(72) Inventors: Zhichao Zhou, Guangdong (CN); Yue Wu, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 0 days.

(21) Appl. No.: 14/908,087

(22) PCT Filed: Dec. 18, 2015

(86) PCT No.: PCT/CN2015/097899
§ 371 (c)(1),
(2) Date: Jan. 27, 2016

(30) Foreign Application Priority Data

Oct. 28, 2015 (CN) .......................... 2015 1 0716083

(51) Int. Cl.
| | |
|---|---|
| H01L 27/14 | (2006.01) |
| H01L 27/12 | (2006.01) |
| H01L 29/49 | (2006.01) |
| H01L 29/45 | (2006.01) |
| H01L 29/417 | (2006.01) |
| H01L 29/423 | (2006.01) |
| H01L 21/443 | (2006.01) |
| H01L 29/786 | (2006.01) |
| H01L 29/66 | (2006.01) |

(52) U.S. Cl.
CPC ........ *H01L 27/1225* (2013.01); *H01L 21/443* (2013.01); *H01L 27/1259* (2013.01); *H01L 29/41733* (2013.01); *H01L 29/42372* (2013.01); *H01L 29/45* (2013.01); *H01L 29/4908* (2013.01); *H01L 29/66969* (2013.01); *H01L 29/7869* (2013.01)

(58) Field of Classification Search
CPC ............. H01L 27/1251; H01L 27/1214; H01L 29/4908
USPC ............................................ 257/59, 72, 432
See application file for complete search history.

(56) References Cited

U.S. PATENT DOCUMENTS

| | | | | |
|---|---|---|---|---|
| 7,384,831 B2 * | 6/2008 | Tsai | ...................... | H01L 29/458 257/E21.413 |
| 2015/0372021 A1 * | 12/2015 | Yuan | ................. | H01L 29/78678 257/72 |

* cited by examiner

*Primary Examiner* — Tan N Tran
(74) *Attorney, Agent, or Firm* — Andrew C. Cheng

(57) ABSTRACT

The present disclosure proposes a TFT. The source and the drain of the TFT are disposed on the same side as the gate. The gate includes a first buffer layer, a first copper layer, a second copper layer and a second buffer layer that are stacked from bottom to top, and the second buffer layer is disposed on the side that is close to the source and drain. The source and drain include a first buffer layer, a first copper layer, a second copper layer and a second buffer layer that are stacked, and the first buffer layer is disposed on the side that is close to the gate. The first copper layer is deposited by a first power, the second copper layer is deposited by a second power lower than the first power. Through the above method, it is prevents photoresist from shedding when etching.

10 Claims, 2 Drawing Sheets

THIN FILM TRANSISTOR, ARRAY SUBSTRATE AND METHOD OF FORMING THE SAME

BACKGROUND OF THE INVENTION

1. Field of the Invention

The present invention relates to the field of display technology, and more specifically, to a thin-film transistor (TFT), an array substrate and a method of forming the same.

2. Description of the Prior Art

In the field of liquid crystal display (LCD), an array substrate installed with TFTs serves as a switch of the LCD panel, whose structure and technology is gravely important to its display effect. To respond to a current need of large-size display device and reduce problems such as resistance-capacitance (RC) delay, a TFT with its gate, source and drain made of low-cost, low-impedance copper is apparently the best choice.

In a conventional production procedure of TFTs, the gate, source and drain of TFTs usually adopt a structure composed of stacked molybdenum layers and copper layers, or titanium layers and copper layers. The molybdenum layer and titanium layer serve as buffer layers. When making TFTs, first, deposit the buffer layers and copper layers respectively, and then produce patterns of the corresponding gate, source and drain through etching. In the process of etching, the shedding of photoresist is common, resulting in over-etching.

SUMMARY OF THE INVENTION

An object of the present invention is to provide a TFT, an array substrate and a method of forming the same, so to prevent photoresist from shedding during the process of etching.

According to the present invention, a thin film transistors (TFT) comprises a gate, a source and a drain, with the source and the drain being disposed on the same side as the gate. The gate comprises a first buffer layer, a first copper layer, a second copper layer and a second buffer layer that are stacked from bottom to top, and the second buffer layer is disposed on the side that is close to the source and drain. The source and drain comprises a first buffer layer, a first copper layer, a second copper layer and a second buffer layer that are stacked from bottom to top, and the first buffer layer is disposed on the side that is close to the gate. The first copper layer is deposited by a first power, the second copper layer is deposited by a second power, with the first power higher than the second power.

In one aspect of the present invention, the first power is between 50 KW and 70 KW, and the second power is between 20 KW and 40 KW.

In another aspect of the present invention, the thickness of the first buffer layer is between 100 Å and 200 Å, the thickness of the first copper layer is between 3000 Å and 5000 Å, the thickness of the second copper layer is between 1000 Å and 2000 Å, and the thickness of the second buffer layer is between 100 Å and 200 Å.

In another aspect of the present invention, the first buffer layer and the second buffer layer is molybdenum film, titanium film, or a stacked structure of molybdenum and titanium films.

In still another aspect of the present invention, at least one of the first buffer layer, the first copper layer, the second copper layer and the second buffer layer is formed by physical vapor deposition (PVD).

In yet another aspect of the present invention, the thin film transistor further comprises a gate insulator (GI) and channel layer disposed between the gate and the source and the drain.

According to the present invention, an array substrate comprises a substrate and a plurality of thin film transistors (TFT) as provided above installed on the substrate.

According to the present invention, a method of forming an array substrate, comprises: forming gates of TFTs on the substrate; forming sources and drains of the TFTs on the gate. The step of forming of the gate and/or the source and drain comprises: forming, from bottom to top, a first buffer layer, a first copper layer, a second copper layer and a second buffer layer, wherein the first copper layer is formed by a first power, the second copper layer is formed by a second power, with the first power higher than the second power; and coating the second buffer layer with photoresist and etching.

In one aspect of the present invention, at least one of the first buffer layer, the first copper layer, the second copper layer and the second buffer layer is formed by physical vapor deposition (PVD).

In another aspect of the present invention, the first power is between 50 KW and 70 KW, and the second power is between 20 KW and 40 KW, the thickness of the first buffer layer is between 100 Å and 200 Å, the thickness of the first copper layer is between 3000 Å and 5000 Å, the thickness of the second copper layer is between 1000 Å and 2000 Å, and the thickness of the second buffer layer is between 100 Å and 200 Å.

In the present invention, at least one of TFT's gate, source and drain adopts a structure of a first buffer layer, a first copper layer, a second copper layer and a second buffer layer. The production power of the first copper layer is higher than that of the second copper layer. The second buffer layer protects the second copper layer, preventing the problem of photoresist shedding resulted from direct etching of the copper layer. In addition, because the production power of the second copper layer is lower, it ensures evenness and smoothness of the surface of the second copper layer, and further ensures that the covering of the second buffer layer of the second copper layer is even and smooth. It prevents photoresist from shedding. Moreover, the high production power of the first copper layer also ensures the production efficiency of TFTs.

DETAILED DESCRIPTION OF THE PREFERRED EMBODIMENTS

For the purpose of description rather than limitation, the following provides such specific details as a specific system structure, interface, and technology for a thorough understanding of the application. However, it is understandable by persons skilled in the art that the application can also be implemented in other embodiments not providing such specific details. In other cases, details of a well-known apparatus, circuit and method are omitted to avoid hindering the description of the application by unnecessary details.

Figure 1:
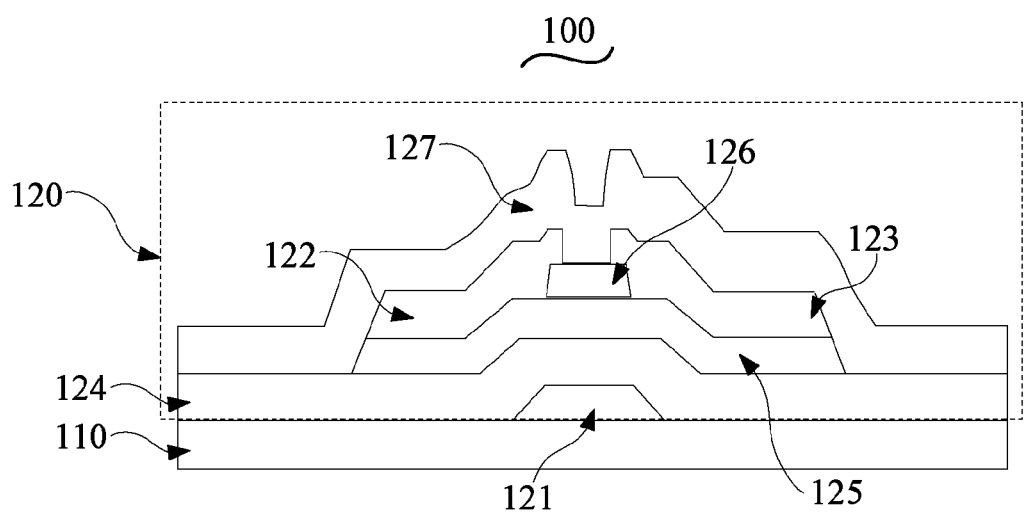
FIG. 1 is a structure diagram of an array substrate according to one embodiment of the present invention.

Please refer to FIG. 1. FIG. 1 is a structure diagram of an embodiment of the array substrate of the present invention. In the present embodiment, an array substrate 100 comprises a substrate 110 and a plurality of TFTs 120 (FIG. 1 only shows one TFT 120 on the substrate 110 as an example). The substrate 110 can be a transparent substrate made of glass or other insulating materials. The TFT 120 comprises a gate 121, a source 122 and a drain 123 installed on the substrate 110. Both the source 122 and drain 123 are installed on the same side as gate 121, away from the substrate 110.

The TFTs 120 can further comprise a gate insulator (GI) 124 and a channel layer 125 that are installed between the gate 121, and the source 122 and drain 123. The GI 124 is sandwiched between the gate 121 and the channel layer 125, so that the gate 121 and channel layer 125 is insulated from each other. The source 122 and drain 123 are disposed on the same layer above the channel layer 125. When the gate 121 receives a voltage that is larger than or equal to a start voltage, the channel layer 125 detects electrons so that the source 122 and drain 123 are turned on. The GI 124 can serve as an aluminum nitride (AlN) film. The channel layer 125 can be formed by metal oxides, such as indium gallium zinc oxide (IGZO).

Preferably, the TFTs 120 further comprise an etch stopper 126 disposed on the channel layer 125 and a passivation layer 127 that covers the source 122 and drain 123. The etch stopper 126 is disposed between the source 122 and drain 123.

Preferably, to increase the aperture ratio of pixel electrodes, the source, drain and pixel electrodes can be embedded in one structure, composed of transparent conductive film.

Figure 2:
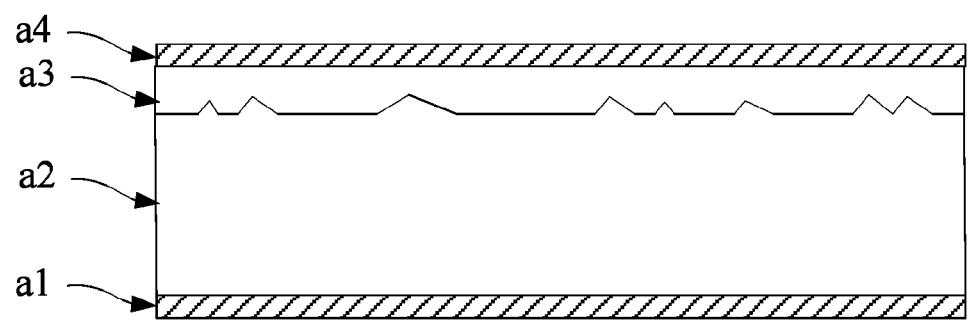
FIG. 2 is a structure diagram of a thin film transistor according to one embodiment of the present invention.

Patterns of the gate 121, source 122 and drain 123 are formed by etching, such as wet etch or dry etch. Please refer to FIG. 2 for specifics. FIG. 2 is a structure diagram of one of the gate, source and drain of an embodiment of the present invention. The gate 121, source 122 and drain 123 of the present embodiment comprise a structure of stacked layers, from bottom to top, of a first buffer layer a1, a first copper layer a2, a second copper layer a3 and a second buffer layer a4. The second buffer layer a4 of the gate 121 is disposed on the side close to the source 122 and drain 123. The first buffer layers a1 of the source 122 and drain 123 are disposed on the side close to the gate 121. The first copper layer a2 is deposited by a first power, meaning that the first copper layer a2 is formed when the deposition facility is operating on a first power. The second copper layer is deposited by a second power, meaning that the second copper layer a3 is formed when the deposition facility is operating on a second power. The first power is higher than the second power.

Specifically, at least one of the first buffer layer a1, the first copper layer a2, the second copper layer a3 and the second buffer layer a4 is formed by deposition methods such as physical vapor deposition (PVD).

The first buffer layer a1 and the second buffer layer a4 are metal layers. They can protect the copper layers and prevent copper ions from proliferation. Specifically, the first buffer layer a1 and the second buffer layer a4 can be molybdenum film, titanium film or stacked structure of molybdenum and titanium films. For example, in another embodiment shown in FIG. 3, the first buffer layer a1 comprises stacked molybdenum film a11 and titanium film a12. The second buffer layer a4 comprises stacked molybdenum film a41 and titanium film a42.

In the present embodiment, the first power is preferred but not limited to be within 50 KW to 70 KW. The second power is preferred but not limited to be within 20 KW to 40 KW. The thickness of the first buffer layer is preferred but not limited to be within 100 Å to 200 Å. The thickness of the first copper layer is preferred but not limited to be within 300 Å to 500 Å. The thickness of the second copper layer is preferred but not limited to be within 100 Å to 200 Å, and the thickness of the second buffer layer is preferred but not limited to be within 100 Å to 200 Å. In an applied embodiment, the first power is 52.5 KW, and the second power is 32.5 KW. The thickness of the first buffer layer is 140 Å, the first copper layer is 3750 Å, the second copper layer is 1250 Å, and the second buffer layer is 140 Å.

It is understandable that in other embodiments, the gate, source and drain of TFTs are not necessarily installed as the abovementioned structure. Other embodiments may install only the gate, or only the source and drain of the TFTs as the abovementioned structure based on actual application.

When the gate, source and drain of TFTs adopt the structure of sandwiching the cooper layers between the first buffer layer and second buffer layer, it can deliver the following effects:

1) The first and second buffer layers can improve the adhesiveness of any structure corresponding to the copper layers and substrate, stop its copper ions from proliferating, and thus prevent current-voltage (I-V) characteristics from decreasing.

2) The second buffer layer protects the cooper layer. When etching, etching selection ratio of the copper layers and second buffer layer is used to lower metal etching taper, and prevent malalignment of GI. It lowers the risk of electrostatic discharge (ESD) and ensures quality.

3) When applying LCD technology, such as fringe field switching (FFS) or in-plane switching (IPS) that requires materials like perfluoroalkoxy alkanes (PFA), the second buffer layer of the source and drain can prevent mismatch of the copper layer and PFA.

Figure 3:
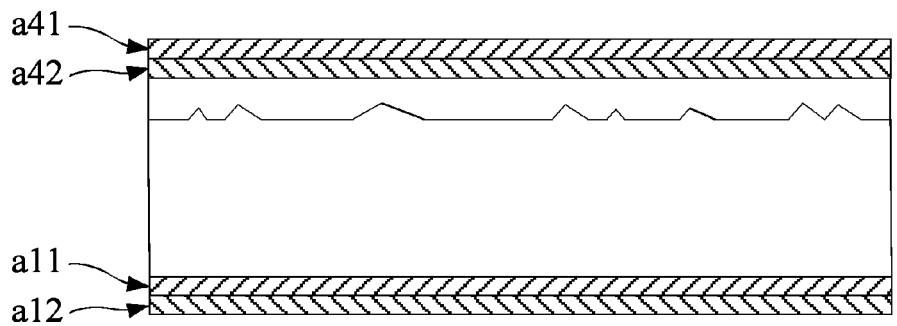
FIG. 3 is a structure diagram of a thin film transistor according to another embodiment of the present invention.

The present embodiment in which the gate, source and drain of the TFTs adopt a first copper layer and a second copper layer formed by different production powers as conductive layers can be analyzed as the following:

The first copper layer deposited by a high power can increase the production speed of the first copper layer, therefore increases the production efficiency of TFTs. But when the first copper layer is forming a film, it causes larger undulations on the surface, as shown in FIG. 2 and FIG. 3. The evenness of its thickness, i.e. U %, is 15% in general as attested. It is difficult to form a theoretically absolute smooth surface. With buffer layers as facilitating layers, its thickness, when comparing with the copper layer, is smaller. Assume that the thickness of the first copper layer is 5000 Å. On a first copper film, the difference between a thick area and a thin area is usually more than 750 Å. On the second buffer layer, the difference is usually no more than 300 Å (the speed by which copper acid etches the buffer layer is slow, therefore the buffer layers are usually thinner). Apparently, the second buffer layer usually cannot effectively cover the surface of the first copper layer, therefore part of the first copper layer is not covered by the second buffer layer. It means that during the etching process, the part of the first copper layer that is not covered by the second buffer layer is usually eroded by acid fluid, so that the photoresist might still easily shed from the metal at the bottom. So a second copper layer formed by lower production power is still deposited above the first copper layer. A low power deposition can effectively improve the evenness and smoothness of the second copper layer, so that the second buffer layer above the second copper layer can provide a more even and smooth cover. Therefore the present invention first adopts high power deposition to form part of the copper layers and then low power deposition to form the rest. It ensures production efficiency and takt time of the copper layers, and the evenness of smoothness of the copper layer surface, so to further prevent photoresist shedding.

FIG. 2 and FIG. 3 are schematic diagrams that show an actual normal surface of a high power deposited copper layer. It does not mean that the first copper layer of each TFT of the present invention forms undulations as shown in FIG. 2 and FIG. 3. Note that the undulation is not the determinant attribute of the first copper layer of the present invention. Theoretically, the first copper layer of the present invention should be formed as even and smooth. The undulation is the effect of the high power deposition.

The present invention further provides an embodiment of the TFTs. Specifically, the structure of the TFTs is the same as that in the previous embodiment, so no further explanation is provided here.

Figure 4:
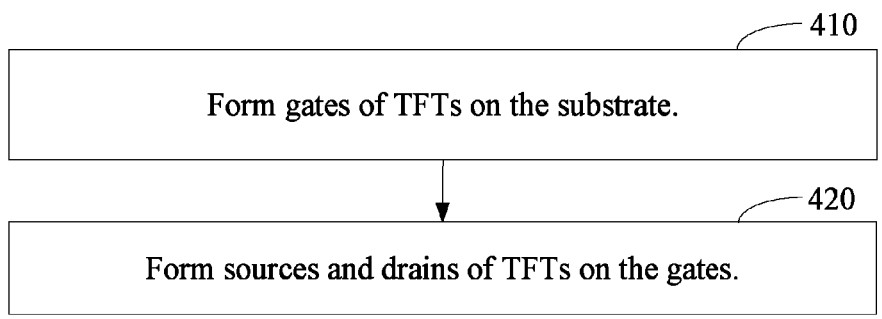
FIG. 4 is a flow chart of a method forming the array substrates according to one embodiment of the present invention.
Figure 5:
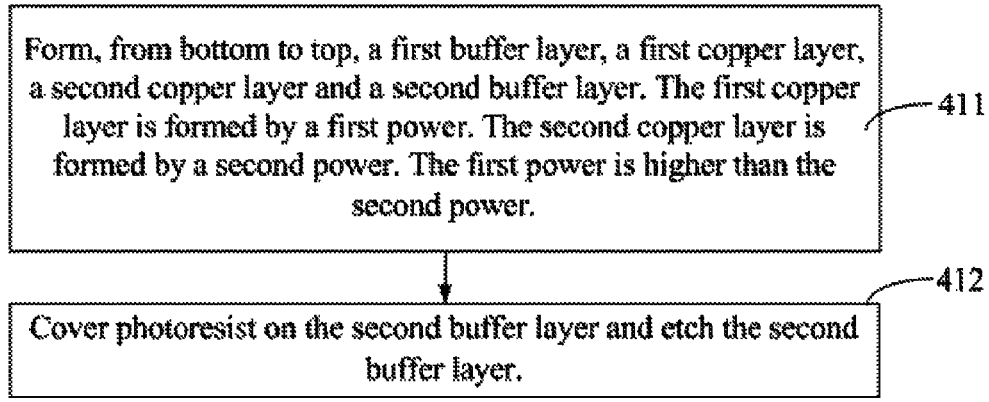
FIG. 5 is a flow chart of sub-steps of step 410 and/or step 420 in FIG. 4.

Please refer to FIG. 4 and FIG. 5. FIG. 4 is a flow chart of an embodiment of a method forming the array substrates of the present invention. FIG. 5 is a flow chart of sub-steps of step 410 and/or step 420 in FIG. 4. The method comprises:

Step 410: form gates of TFTs on the substrate.

Step 420: form sources and drains of TFTs on the gates.

Sub-steps of form the gate as described in step 410, and/or forming the source and drain as described in step 420 can comprise the following:

Sub-step 411: form, from bottom to top, a first buffer layer, a first copper layer, a second copper layer and a second buffer layer. The first copper layer is formed by a first power. The second copper layer is formed by a second power. The first power is higher than the second power.

At least one of the first buffer layer, the first copper layer, the second copper layer and the second buffer layer is formed by methods such as plasma vapor deposition (PVD). The first and second buffer layers are metal, such as molybdenum film, titanium film or stacked molybdenum and titanium films.

In the present embodiment, the first power is preferred but not limited to be within 50 KW to 70 KW. The second power is preferred but not limited to be within 20 KW to 40 KW. The thickness of the first buffer layer is preferred but not limited to be within 100 Å to 200 Å. The thickness of the first copper layer is preferred but not limited to be within 300 Å to 500 Å. The thickness of the second copper layer is preferred but not limited to be within 100 Å to 200 Å, and the thickness of the second buffer layer is preferred but not limited to be within 100 Å to 200 Å.

Sub-step 412: cover photoresist on the second buffer layer and etch the second buffer layer. The methods of etching include wet etch and dry etch.

In another embodiment, after the step 410, the forming method can also comprise forming a GI and channel layer on the gate. The GI is stacked between the gate and channel layer, and the GI can be an AlN film. The step 420, more specifically, is to form the source and drain on the channel layer.

In another embodiment, after the step 420, the forming method can further comprise forming an etch stopper on the source and drain on the channel layer, and installing the etch stopper between the source and drain; or forming a passivation layer on the source and drain.

In the methods mentioned above, at least one of the gate, source and drain of TFTs adopts the structure composed of a first buffer layer, a first copper layer, a second copper layer and a second buffer layer. The production power of the first copper layer is higher than that of the second copper layer. The second buffer layer protects the second copper layer, preventing photoresist shedding due to direct etching of copper layers. And, because the production power of the second copper layer is lower, it ensures that the surface of the second copper layer is even and smooth, which further ensures that the cover provided by the second buffer layer to the second copper layer is even and smooth, and prevents photoresist shedding. In addition, the high production power also ensures the production efficiency of the TFTs.

The present disclosure is described in detail in accordance with the above contents with the specific preferred examples. However, this present disclosure is not limited to the specific examples. For the ordinary technical personnel of the technical field of the present disclosure, on the premise of keeping the conception of the present disclosure, the technical personnel can also make simple deductions or replacements, and all of which should be considered to belong to the protection scope of the present disclosure.

What is claimed is:

1. An array substrate, comprising a substrate and a plurality of thin film transistors (TFT) installed on the substrate, with the TFTs comprising a gate, a source and a drain, the source and the drain being disposed on the same side as the gate; wherein the gate comprises a first buffer layer, a first copper layer, a second copper layer and a second buffer layer that are stacked from bottom to top, and the second buffer layer is disposed on the side that is close to the source and drain;

and the source and drain comprises a first buffer layer, a first copper layer, a second copper layer and a second buffer layer that are stacked from bottom to top, and the first buffer layer is disposed on the side that is close to the gate;

the first copper layers of the gate, and source and drain is deposited by a first power, the second copper layers of the gate, and source and drain is deposited by a second power, with the first power higher than the second power, wherein the first power is between 50 KW and 70 KW, and the second power is between 20 KW and 40 KW wherein thicknesses of the first buffer layers in the gate, and source and drain is between 100 Angstroms and 200 Angstroms, thicknesses of the first copper layers in the gate, and source and drain is between 3000 Angstroms and 5000 Angstroms, thicknesses of the second copper layers in the gate, and source and drain is between 1000 Angstroms and 2000 Angstroms, and thicknesses of the second buffer layers in the gate, and source and drain is between 100 Angstroms and 200 Angstroms.

2. The array substrate of claim 1, wherein the first buffer layer and the second buffer layer of the gate, and source and drain is molybdenum film, titanium film, or a stacked structure of molybdenum and titanium films.

3. The array substrate of claim 1, wherein at least one of the first buffer layers, the first copper layers, the second copper layers and the second buffer layers in the gate, source, and drain is formed by physical vapor deposition (PVD).

4. The array substrate of claim 1, wherein the thin film transistor further comprises a gate insulator (GI) and channel layer disposed between the gate and the source and the drain.

5. A thin film transistors (TFT) comprising a gate, a source and a drain, with the source and the drain being disposed on the same side as the gate, wherein
the gate comprises a first buffer layer, a first copper layer, a second copper layer and a second buffer layer that are stacked from bottom to top, and the second buffer layer is disposed on the side that is close to the source and drain;
and the source and drain comprises a first buffer layer, a first copper layer, a second copper layer and a second buffer layer that are stacked from bottom to top, and the first buffer layer is disposed on the side that is close to the gate;
the first copper layers of the gate, and source and drain is deposited by a first power, the second copper layers of the gate, and source and drain is deposited by a second power, with the first power higher than the second power, wherein the first power is between 50 KW and 70 KW, and the second power is between 20 KW and 40 KW wherein thicknesses of the first buffer layers in the gate, and source and drain is between 100 Angstroms and 200 Angstroms, thicknesses of the first copper layers in the gate, and source and drain is between 3000 Angstroms and 5000 Angstroms, thicknesses of the second copper layers in the gate, and source and drain is between 1000 Angstroms and 2000 Angstroms, and thicknesses of the second buffer layers in the gate, and source and drain is between 100 Angstroms and 200 Angstroms.

6. The thin film transistor of claim 5, wherein the first buffer layer and the second buffer layer of the gate, and source and drain is molybdenum film, titanium film, or a stacked structure of molybdenum and titanium films.

7. The thin film transistor of claim 5, wherein at least one of the first buffer layers, the first copper layers, the second copper layers and the second buffer layers in the gate, source, and drain is formed by physical vapor deposition (PVD).

8. The thin film transistor of claim 5, further comprising a gate insulator (GI) and channel layer disposed between the gate and the source and the drain.

9. A method of forming an array substrate, comprising:
forming gates of TFTs on the substrate;
forming sources and drains of the TFTs on the gate;
wherein the forming of the gate and the source and drain comprises:
forming, from bottom to top, a first buffer layer, a first copper layer, a second copper layer and a second buffer layer, wherein the first copper layer is formed by a first power, the second copper layer is formed by a second power, with the first power higher than the second power, wherein the first power is between 50 KW and 70 KW, and the second power is between 20 KW and 40 KW, a thickness of the first buffer layer is between 100 Å and 200 Å, a thickness of the first copper layer is between 3000 Å and 5000 Å, a thickness of the second copper layer is between 1000 Å and 2000 Å, and a thickness of the second buffer layer is between 100 Å and 200 Å; and
coating the second buffer layer with photoresist and etching.

10. The method of claim 9, wherein at least one of the first buffer layer, the first copper layer, the second copper layer and the second buffer layer is formed by physical vapor deposition (PVD).

* * * * *